United States Patent
Du et al.

(10) Patent No.: US 10,353,260 B2
(45) Date of Patent: Jul. 16, 2019

(54) DISPLAY PANEL AND DISPLAY DEVICE

(71) Applicant: Shanghai Tianma Micro-Electronics Co., Ltd., Shanghai (CN)

(72) Inventors: Lingxiao Du, Shanghai (CN); Kang Yang, Shanghai (CN); Huiping Chai, Shanghai (CN); Hong Ding, Shanghai (CN)

(73) Assignee: SHANGHAI TIANMA MICRO-ELECTRONIC CO., LTD., Shanghai (CN)

( * ) Notice: Subject to any disclaimer, the term of this patent is extended or adjusted under 35 U.S.C. 154(b) by 0 days.

(21) Appl. No.: 15/787,403

(22) Filed: Oct. 18, 2017

(65) Prior Publication Data

US 2018/0364534 A1  Dec. 20, 2018

(30) Foreign Application Priority Data

Jun. 19, 2017 (CN) .......................... 2017 1 0466979

(51) Int. Cl.
*H01L 27/12* (2006.01)
*G02F 1/1335* (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC ......... G02F 1/133514; G02F 1/133512; G02F 1/1368; G02F 1/1339; G02F 1/13394;
(Continued)

(56) References Cited

U.S. PATENT DOCUMENTS 9,286,837 B2 * 3/2016 Cho ...................... G09G 3/2003
2012/0050657 A1 * 3/2012 Lin .................... G02F 1/136286
349/139
(Continued)

FOREIGN PATENT DOCUMENTS

CN   101308294 A   11/2008
CN   103424916 A   12/2013

OTHER PUBLICATIONS

Chinese Office Action dated Apr. 22, 2019 for corresponding CN Application No. 201710466979.5.

*Primary Examiner* — Natalia A Gondarenko
(74) *Attorney, Agent, or Firm* — Tarolli, Sundheim, Covell & Tummino LLP

(57) ABSTRACT

Provided is a display panel, including an array substrate and a color film substrate; in the array substrate, every two adjacent columns of highlight sub-pixels form a group of highlight sub-pixels, at least one column of color sub-pixels is arranged between any two groups of highlight sub-pixels; the color film substrate includes a black matrix and color filters arranged in array, the black matrix includes a first and second black matrixes, the color filter includes columns of highlight color filters and columns of colored color filters, every two adjacent columns of highlight color filters form a group of highlight color filters, at least one column of colored color filters is arranged between any two groups of highlight color filters; on the color film substrate, orthogonal projection of the second black matrix does not overlap with orthogonal projection of the gap between the two adjacent columns of highlight color filters.

8 Claims, 18 Drawing Sheets

(51) Int. Cl.
*G02F 1/1362* (2006.01)
*G02F 1/1368* (2006.01)
*H01L 31/00* (2006.01)
*H01L 33/08* (2010.01)

(52) U.S. Cl.
CPC .. *G02F 1/133512* (2013.01); *G02F 1/133514* (2013.01); *H01L 27/124* (2013.01); *G02F 2201/123* (2013.01)

(58) Field of Classification Search
CPC ......... G02F 1/167; G02F 2001/133519; G02F 1/136286; G02F 1/13624; G02F 2201/123; H01L 27/12; H01L 27/1214–27/1296; H01L 27/3244–27/3279; H01L 27/1218; H01L 2021/775; H01L 27/124; H01L 27/14621; H01L 27/1463; H01L 27/32–27/3293; H01L 27/322; H01L 51/50–51/56; H01L 2227/32–2227/326; H01L 31/0232; H01L 31/16; H01L 31/167; H01L 31/173; H01L 33/50; H01L 33/504

USPC ...... 349/106, 154, 155, 153; 257/72, 59, 89, 257/88, 99; 438/29, 30, 34, 35
See application file for complete search history.

(56) References Cited

U.S. PATENT DOCUMENTS

| | | | | |
|---|---|---|---|---|
| 2012/0287382 | A1* | 11/2012 | Qi | G02F 1/133512 349/106 |
| 2012/0307163 | A1* | 12/2012 | Fujine | G02F 1/133514 348/791 |
| 2013/0050282 | A1* | 2/2013 | Kim | G09G 3/3413 345/690 |
| 2014/0111411 | A1* | 4/2014 | Guo | G09G 3/2003 345/88 |
| 2015/0187856 | A1* | 7/2015 | Park | H01L 27/3272 257/40 |
| 2015/0302808 | A1* | 10/2015 | Wang | G02F 1/1335 345/691 |
| 2016/0253940 | A1* | 9/2016 | Wang | G09G 3/20 345/694 |
| 2017/0301696 | A1* | 10/2017 | Yang | H01L 27/124 |

* cited by examiner

DISPLAY PANEL AND DISPLAY DEVICE

CROSS-REFERENCE TO RELATED APPLICATIONS

The present application claims the benefit of priority to Chinese Patent Application No. 201710466979.5, filed on Jun. 19, 2017, the content of which is incorporated herein by reference in its entirety.

TECHNICAL FIELD

The present disclosure relates to the field of display technologies and, particularly, relates to a display panel and a display device.

BACKGROUND

In a conventional display panel, each pixel normally adopts a three-color sub-pixel structure, i.e., RGB (Red, Green, Blue) structure. In order to improve brightness of the display panel and reduce power consumption of the display panel, recently, for a display panel, each pixel adopts a RGBW (Red, Green, Blue, White) four-color sub-pixel structure, that is, adding a white transparent sub-pixel in the original RGB three-color sub-pixel structure, thereby the brightness can be improved and the power consumption can be reduced.

However, it is found that, in order to prevent from color mixture of adjacent sub-pixels with different colors, it is necessary to arrange a black matrix around each sub-pixel, resulting in that the area occupied by the black matrix for light shading in the display area of the display panel is large, and the open rate of the display panel is low, thereby causing a poor transparent display effect of the display panel.

SUMMARY

In view of the above, the embodiment of the present disclosure provides a display panel and a display device, so as to solve the technical problems of low open rate and poor transparent display effect of the display panel in the prior art.

In a first aspect, the embodiment of the present disclosure provides a display panel, including: an array substrate; and a color film substrate arranged opposite to the array substrate; wherein the array substrate includes a plurality of columns of highlight sub-pixels and a plurality of columns of color sub-pixels; every two adjacent columns of highlight sub-pixels form a group of highlight sub-pixels, at least one column of color sub-pixels is arranged between any two groups of highlight sub-pixels; each column of color sub-pixels includes at least one type of a first color sub-pixel, a second color sub-pixel and a third color sub-pixel; and wherein the color film substrate includes a black matrix and a plurality of color filters arranged in an array; in a row direction, the black matrix includes a first black matrix corresponding to a gap between adjacent two sub-pixels and, in a column direction, the black matrix includes a second black matrix corresponding to a gap between adjacent two sub-pixels; the plurality of color filters includes a plurality of columns of highlight color filters and a plurality of columns of colored color filters, every two adjacent columns of highlight color filters form a group of highlight color filters, at least one column of colored color filters is arranged between any two groups of highlight color filters, and each column of colored color filters includes at least one type of a first colored color filter, a second colored color filter and a third colored color filter; an orthogonal projection of the second black matrix on the color film substrate does not overlap with an orthogonal projection of the gap between the two adjacent columns of highlight color filters on the color film substrate.

In a second aspect, the embodiment of the present disclosure provides a display device, including a display panel, wherein the display panel includes: an array substrate; and a color film substrate arranged opposite to the array substrate; wherein the array substrate includes a plurality of columns of highlight sub-pixels and a plurality of columns of color sub-pixels; every two adjacent columns of highlight sub-pixels form a group of highlight sub-pixels, at least one column of color sub-pixels is arranged between any two groups of highlight sub-pixels; each column of color sub-pixels includes at least one type of a first color sub-pixel, a second color sub-pixel and a third color sub-pixel; and wherein the color film substrate includes a black matrix and a plurality of color filters arranged in an array; in a row direction, the black matrix includes a first black matrix corresponding to a gap between adjacent two sub-pixels and, in a column direction, the black matrix includes a second black matrix corresponding to a gap between adjacent two sub-pixels; the plurality of color filters includes a plurality of columns of highlight color filters and a plurality of columns of colored color filters, every two adjacent columns of highlight color filters form a group of highlight color filters, at least one column of colored color filters is arranged between any two groups of highlight color filters, and each column of colored color filters includes at least one type of a first colored color filter, a second colored color filter and a third colored color filter; an orthogonal projection of the second black matrix on the color film substrate does not overlap with an orthogonal projection of the gap between the two adjacent columns of highlight color filters on the color film substrate.

The embodiments of the present disclosure provide a display panel and a display device, in the display panel, every two adjacent columns of highlight sub-pixels in the array substrate form a group of highlight sub-pixels, at least one column of color sub-pixels is arranged between any two groups of highlight sub-pixels, correspondingly, every two adjacent columns of highlight color filters in the color film substrate form a group of highlight color filters, at least one column of colored color filters is arranged between any two groups of highlight color filters. Since the colors of the output light of adjacent two columns of highlight sub-pixels and adjacent two columns of highlight color filters are the same, color mixture will not occur, thus the orthogonal projection of the second black matrix on the color film substrate does not overlap with the orthogonal projection of the gap between the adjacent two columns of highlight color filters on the color film substrate, which effectively reduces the area occupied by the black matrix for light shading in the display area of the display panel, and improves the open rate of the display panel, thereby improving the transparent display effect of the display panel.

BRIEF DESCRIPTION OF DRAWINGS

In order to more clearly illustrate the technical solutions in embodiments of the present invention, a brief introduction of the drawings used in the embodiments will be provided as follows. Obviously, the drawings described below are merely some embodiments of the present invention, those skilled in the art can also obtain other drawings according to these drawings without creative work.

DESCRIPTION OF EMBODIMENTS

In order to better understand the technical solutions of the present disclosure, the present disclosure will be described in detail with reference to the accompanying drawings.

It should be noted that, the embodiments described are only a part of the embodiments of the present disclosure, rather than all of the embodiments. Based on the embodiments in the present disclosure, all other embodiments obtained by those skilled in the art without creative work shall belong to the protection scope of the present disclosure.

The terms used in the embodiments of the present disclosure are only used for the describing specific embodiments, but not intended to limit the present disclosure. The singular form of 'a', 'an', 'the' and 'said' used in the embodiments of the present disclosure and the appended claims is intended to include the plural form, unless otherwise clearly indicated in the context.

It should be understood that, although the embodiments of the present disclosure adopts terms such as first, second, third and the like to describe the color sub-pixels (or black matrixes), these color sub-pixels (or black matrixes) should not be limited by these terms. These terms only are used to distinguish the color sub-pixels (or black matrixes) from each other. For example, without departing from the scope of the embodiments of the present disclosure, a first color sub-pixel (or black matrix) can also be called as a second color sub-pixel (or black matrix), similarly, a second color sub-pixel (or black matrix) can also be called as a first color sub-pixel (or black matrix).

Figure 1:
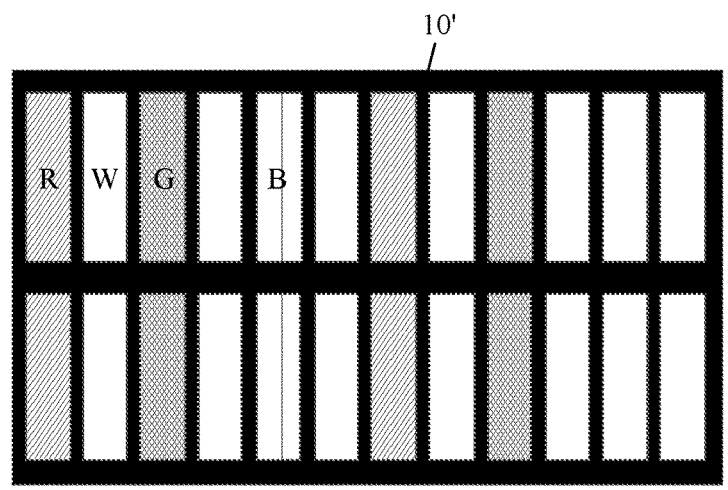
FIG. 1 illustrates a top view of a display panel in the prior art.

As shown in FIG. 1, FIG. 1 illustrates a top view of a display panel in the prior art. Each pixel (shown in the dotted frame in FIG. 1) in the display panel adopts a RGBW (Red, Green, Blue, White) four-color sub-pixel structure, that is, adding a white transparent sub-pixel in the original RGB three-color sub-pixel structure, so as to improve the brightness and reduce power consumption.

However, it is found that, since the arrangement of the sub-pixels is as shown in FIG. 1, in order to prevent from color mixture of adjacent sub-pixels with different colors, it is necessary to arrange a black matrix 10' around each sub-pixel, resulting in that the area occupied by the black matrix 10' for light shading in the display area of the display panel is large, and the open rate of the display panel is low, thereby causing a poor transparent display effect of the display panel.

Figure 2:
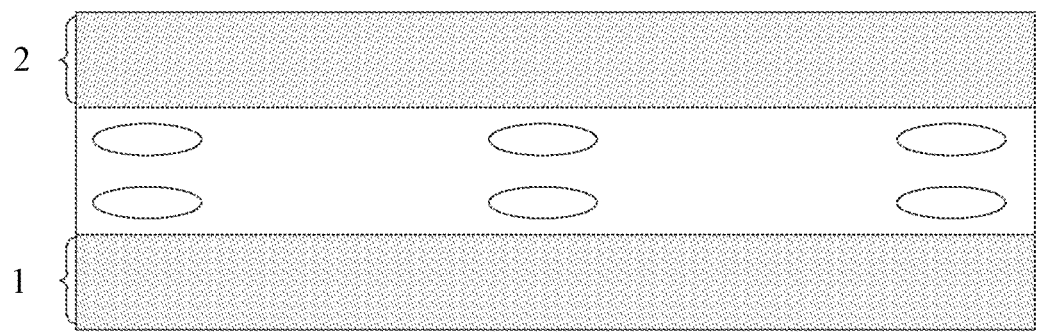
FIG. 2 illustrates a cross-sectional schematic diagram of a display panel according to an embodiment of the present disclosure.

An embodiment of the present disclosure provides a display panel, as shown in FIG. 2, FIG. 2 illustrates a cross-sectional schematic diagram of a display panel according to an embodiment of the present disclosure. The display panel includes an array substrate 1 and a color film substrate 2 arranged opposite to the array substrate 1. The display panel further includes a liquid crystal layer located between the array substrate 1 and the color film substrate 2.

Figure 3:
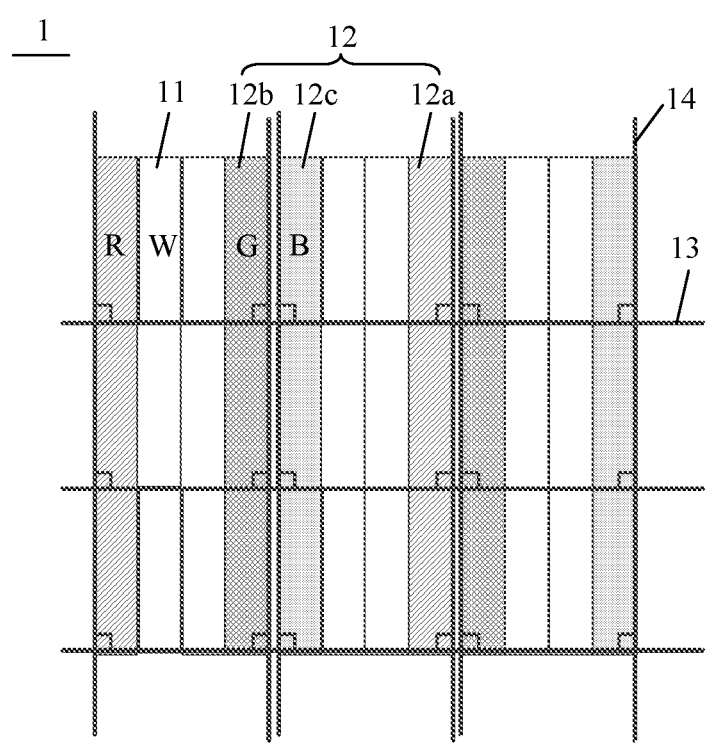
FIG. 3 illustrates a first top view of an array substrate according to an embodiment of the present disclosure.

As shown in FIG. 3, FIG. 3 illustrates a first top view of an array substrate according to an embodiment of the present disclosure. The array substrate 1 includes a plurality of columns of highlight sub-pixels 11 and a plurality of columns of color sub-pixels 12. Every two adjacent columns of highlight sub-pixels form a group of highlight sub-pixels 11, and at least one column of color sub-pixels 12 is arranged between any two groups of highlight sub-pixels 11. Each column of color sub-pixels 12 include one, two or three of a first color sub-pixel 12a, a second color sub-pixel 12b and a third color sub-pixel 12c. As shown in FIG. 3, one column of color sub-pixels 12 is arranged between any two groups of highlight sub-pixels 11, and the color sub-pixel 12 in each column is a first color sub-pixel 12a or a second color sub-pixel 12b or a third color sub-pixel 12c.

Figure 4:
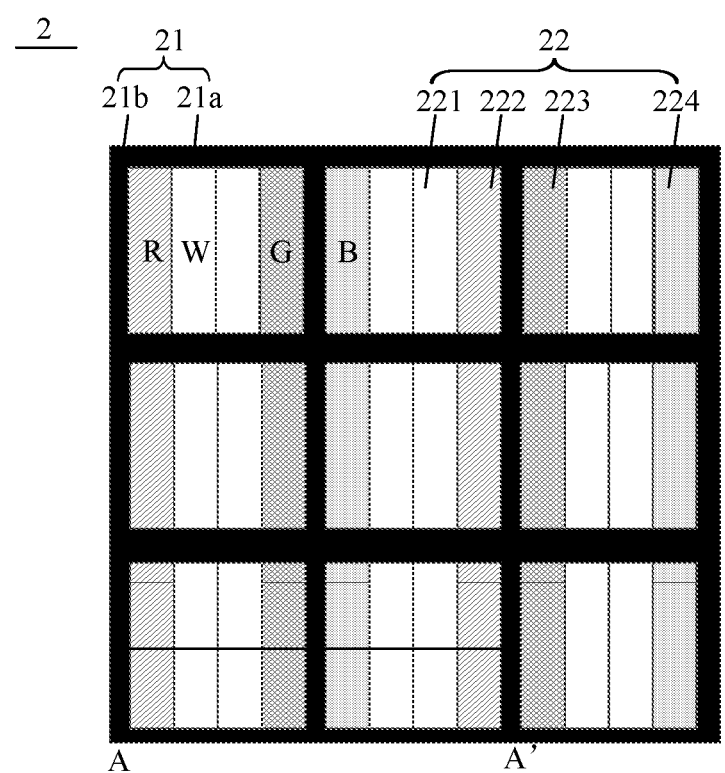
FIG. 4 illustrates a first top view of a color film substrate according to an embodiment of the present disclosure.

As shown in FIG. 4, FIG. 4 illustrates a first top view of a color film substrate according to an embodiment of the present disclosure. The color film substrate 2 includes a black matrix 21, and a plurality of color filters 22 arranged in an array. In a row direction of the color film substrate 2, the black matrix 21 includes a first black matrix 21a corresponding to a gap between adjacent two sub-pixels and, in a column direction of the color film substrate 2, the black matrix 21 includes a second black matrix 21b corresponding to a gap between adjacent two sub-pixels. That is, an extending direction of the first black matrix 21a is the row direction of the color film substrate 2, and an extending direction of the second black matrix 21b is the column direction of the color film substrate 2. The plurality of color filters 22 includes a plurality of columns of highlight color filters 221 and a plurality of columns of colored color filters, every two adjacent columns of highlight color filters 221 form a group of highlight color filters 221, and at least one column of colored color filters is arranged between any two groups of highlight color filters 221. Each column of colored color filters includes one, two or three of a first colored color filter 222, a second colored color filter 223 and a third colored color filter 224. An orthogonal projection of the second black matrix 21b on the color film substrate 2 does not overlap with an orthogonal projection of the gap between the adjacent two columns of highlight color filters 221, that is, no second black matrix 21b is provided at the gap of the adjacent two columns of highlight color filters 221.

It should be noted that, the number of column of color sub-pixels 12 between any two groups of highlight sub-pixels 11 corresponds to the number of column of colored color filters arranged between any two groups of highlight color filter 221. For example, as shown in FIG. 3, two columns of color sub-pixels 12 are arranged between any two groups of highlight sub-pixels 11, correspondingly, as shown in FIG. 4, two columns of colored color filters are arranged between any two groups of highlight color filters 221. As for the situations with other numbers of column of color sub-pixels 12 arranged between any two groups of highlight sub-pixels 11, and other numbers of column of colored color filters arranged between any two groups of highlight color filters 221, will be illustrated in the following contents of the embodiments of the present disclosure.

Figure 5:
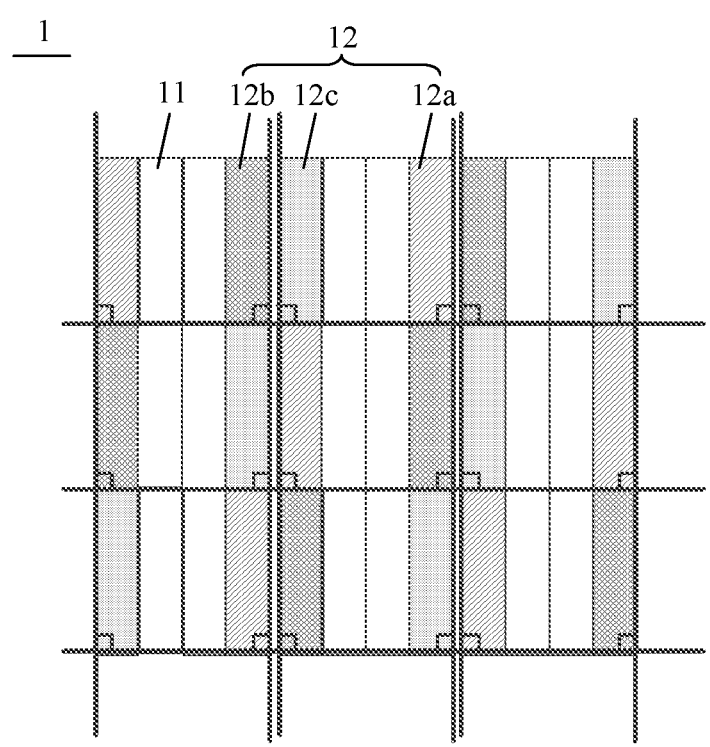
FIG. 5 illustrates a second top view of an array substrate according to an embodiment of the present disclosure.
Figure 6:
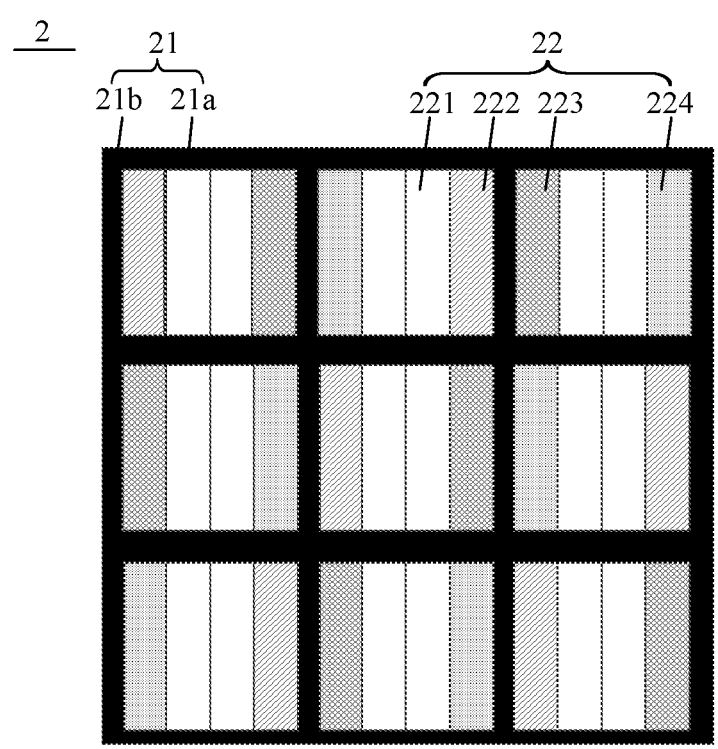
FIG. 6 illustrates a second top view of a color film substrate according to an embodiment of the present disclosure.

Similarly, the type of the color sub-pixel included in each column of color sub-pixels 12 also corresponds to the type of the colored color filter included in each column of colored color filters. In an example, as shown in FIG. 3, each column of color sub-pixels 12 only includes one of the first color sub-pixel 12a, the second color sub-pixel 12b and the third color sub-pixel 12c, correspondingly, as shown in FIG. 4, each column of colored color filters only includes one of the first colored color filter 222, the second colored color filter 223 and the third colored color filter 224. In another example, as shown in FIG. 5, FIG. 5 illustrates a second top view of an array substrate according to an embodiment of the present disclosure. Each column of color sub-pixels 12 includes a first color sub-pixel 12a, a second color sub-pixel 12b and a third color sub-pixel 12c, and the first color sub-pixel 12a, the second color sub-pixel 12b and the third color sub-pixel 12c are successively arranged alternatively. Correspondingly, as shown in FIG. 6, FIG. 6 illustrates a second top view of a color film substrate according to an embodiment of the present disclosure. Each column of colored color filters includes a first colored color filter 222, a second colored color filter 223 and a third colored color filter 224, and the first colored color filter 222, the second colored color filter 223 and the third colored color filter 224 are successively arranged alternatively.

Figure 7:
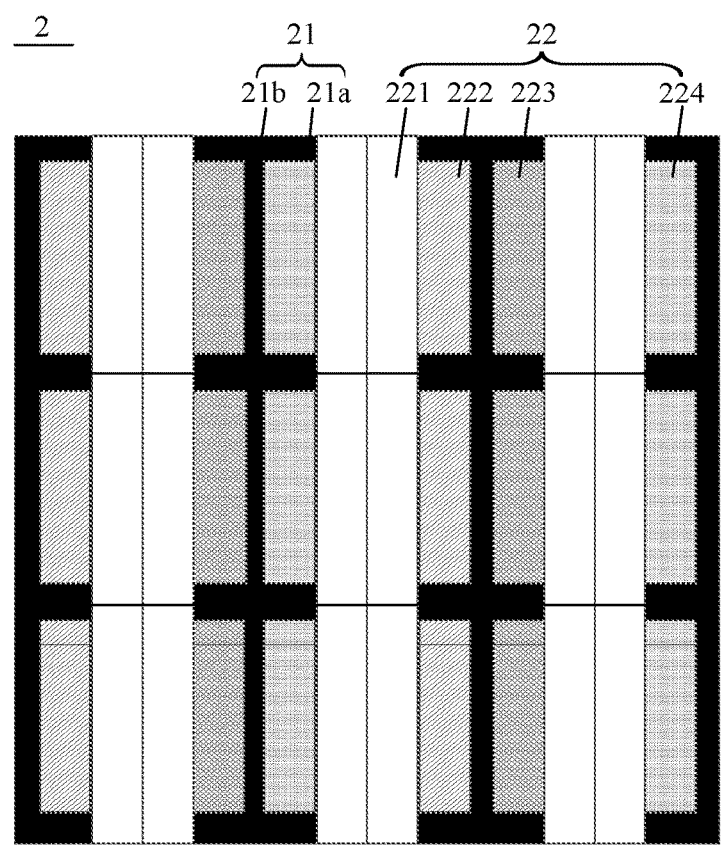
FIG. 7 illustrates a third top view of a color film substrate according to an embodiment of the present disclosure.

Optionally, as shown in FIG. 7, FIG. 7 illustrates a third top view of a color film substrate according to an embodiment of the present disclosure. An orthogonal projection of the first black matrix 21a on the color film substrate 2 does not overlap with an orthogonal projection of the adjacent two highlight color filters 221, so as to further reduce the area occupied by the black matrix 21 in the display area of the display panel, further improve the open rate of the display panel, and improve transparent display effect of the display panel.

Optionally, the first color sub-pixel 12a, the second color sub-pixel 12b and the third color sub-pixel 12c of the embodiments of the present disclosure are respectively one of the red sub-pixel, the green sub-pixel and the blue sub-pixel. Correspondingly, the first colored color filter 222, the second colored color filter 223 and the third colored color filter 224 in the embodiments of the present disclosure are respectively one of the red color filter, the green color filter and the blue color filter. For example, as shown in FIG. 3, the first color sub-pixel 12a is a red sub-pixel (indicated by R in FIG. 3), the second color sub-pixel 12b is a green sub-pixel (indicated by G in FIG. 3), and the third color sub-pixel 12c is a blue sub-pixel (indicated by B in FIG. 3). For example, as shown in FIG. 4, the first colored color filter is a red color filter (indicated by R in FIG. 4), the second colored color filter is a green color filter (indicated by G in FIG. 4), and the third colored color filter is a blue color filter (indicated by B in FIG. 4).

Figure 8:
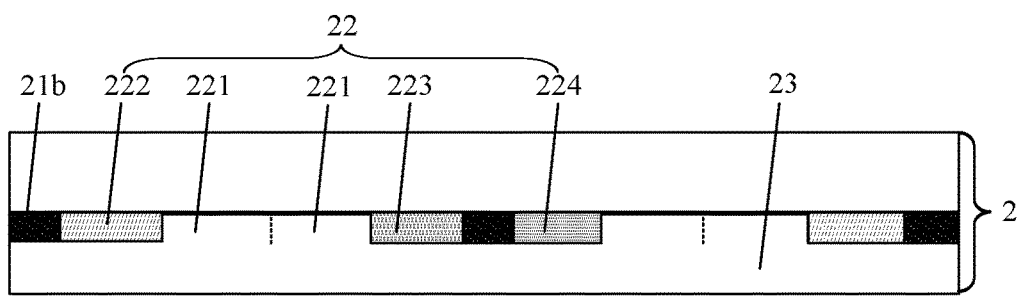
FIG. 8 illustrates a cross-sectional schematic diagram along A-A' direction in FIG. 4 according to an embodiment of the present disclosure.

Optionally, the highlight sub-pixel 11 is a white sub-pixel or a yellow sub-pixel. Correspondingly, the highlight color filter in the embodiments of the present disclosure is a white color filter or a yellow color filter. As shown in FIG. 4, when the highlight color filter 221 is a white color filter, as shown in FIG. 8, FIG. 8 illustrates a cross-sectional schematic diagram along A-A' direction in FIG. 4 according to an embodiment of the present disclosure, the color film substrate 2 further includes a transparent protection layer 23 located at a side of the color filters 22 arranged in array close to the array substrate, the material of the highlight color filter 221 is the same as that of the transparent protection layer 23, that is, during the process of making the color film substrate 2, the colored color filter is made firstly, after the colored color filter is made, an area corresponding to the highlight color filter is blank, then during the process of making the transparent protection layer 23, the material corresponding to the transparent protection layer 23 is filled in said area, so as to form the highlight color filter 221. Optionally, the highlight color filter 221 and the transparent protection layer 23 are made of a transparent resin.

Optionally, as shown in FIG. 3, each sub-pixel has a rectangle shape, and has a same size, a width-length ratio thereof is 1:2 or 1:3.

In addition, since every two adjacent columns of highlight sub-pixels 11 in the array substrate 1 form a group of highlight sub-pixels 11, at least one column of color sub-pixels 12 is arranged between any two groups of highlight sub-pixels 11, correspondingly, every two adjacent columns of highlight color filters 221 in the color film substrate 2 form a group of highlight color filters 221, at least one column of colored color filters is arranged between any two groups of highlight color filters 221, so that the colors of the output light of adjacent two columns of highlight sub-pixels 11 or adjacent two columns of highlight color filters 221 are the same, color mixing will not occur; further, since the orthogonal projection of the second black matrix 21b on the color film substrate 2 does not overlap with the orthogonal projection of the gap between the adjacent two columns of highlight color filters 221, the area occupied by the black matrix 21 for light shading in the display area of the display panel is effectively reduced, which improves the open rate of the display panel, thereby improving the transparent display effect of the display panel.

Figure 9:
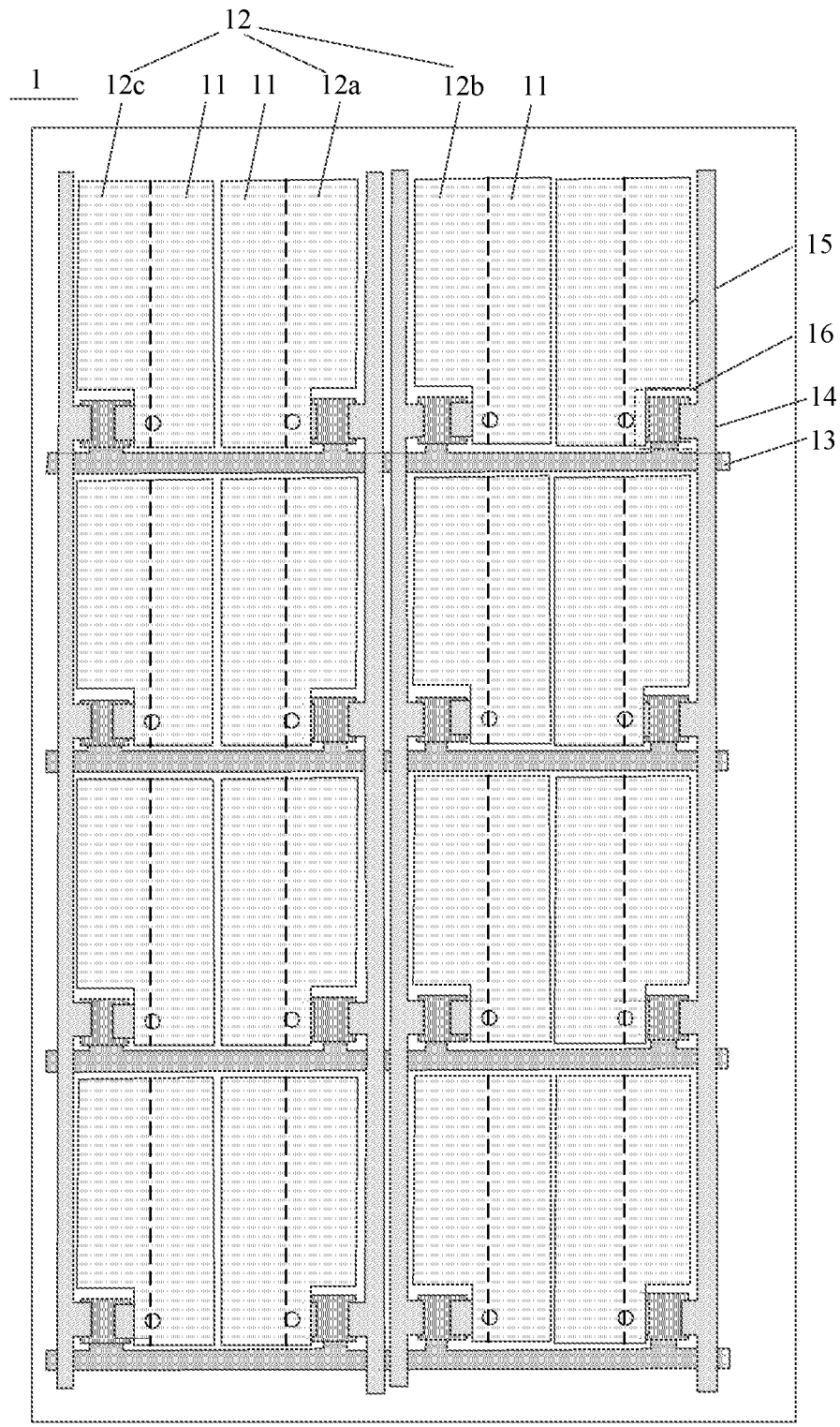
FIG. 9 illustrates a third top view of an array substrate according to an embodiment of the present disclosure.

As shown in FIG. 9, FIG. 9 illustrates a third top view of an array substrate according to an embodiment of the present disclosure. Generally, the array substrate 1 is further provided with a plurality of gate lines 13 extending along the row direction of the array substrate 1, and a plurality of data lines 14 extending along the column direction of the array substrate 1, the gate lines 13 and the data lines 14 cooperatively define a plurality of pixel areas, the gate lines 13 are located between adjacent two rows of pixel areas, the data line 14 is located between adjacent two columns of pixel areas. A pixel electrode 15 and a thin film transistor switch 16 are arranged in each pixel area. A gate electrode of the thin film transistor switch 16 is electrically connected with the gate lines 13, a source electrode of the thin film transistor switch 16 is electrically connected with the data line 14, and a drain source of the thin film transistor switch 16 is electrically connected with the pixel electrode 15. The gate line 13 is used for controlling the thin film transistor switch 16 in the pixel area to be turn-on and turn-off, the data line 14 is used for writing a data signal to the pixel electrode 15 corresponding to the pixel area when the thin film transistor switch 16 is turned on.

Since the orthogonal projection of the second black matrix 21b on the color film substrate 2 does not overlap with the orthogonal projection of the gap between adjacent two columns of highlight color filters 221 on the color film substrate 2, that is, an orthogonal projection of the second black matrix 21b on the array substrate 1 does not overlap with the data line between adjacent two columns of highlight sub-pixels 11 do not overlap; however, if a data line is arranged therebetween, and the data line is made of metal, the data line will reflect the light when the light outside the display panel reaches the data line, thereby causing adverse influence to the display effect. In order to avoid the above-mentioned problem, as shown in FIG. 3 and FIG. 9, there is on data line 14 between the two columns of highlight sub-pixels 11 included in each group of highlight sub-pixels 11 according to embodiments of the present disclosure. Based on this, there are various arrangement manners of the data lines 14 on the array substrate 1, and the arrangement manner of the data lines 14 has a certain relation with the arrangement of the sub-pixels. The following embodiments of the present disclosure will illustrate the arrangement manners of the data lines on the array substrate 1 which satisfy the above-mentioned conditions for different arrangements of sub-pixels.

Figure 10:
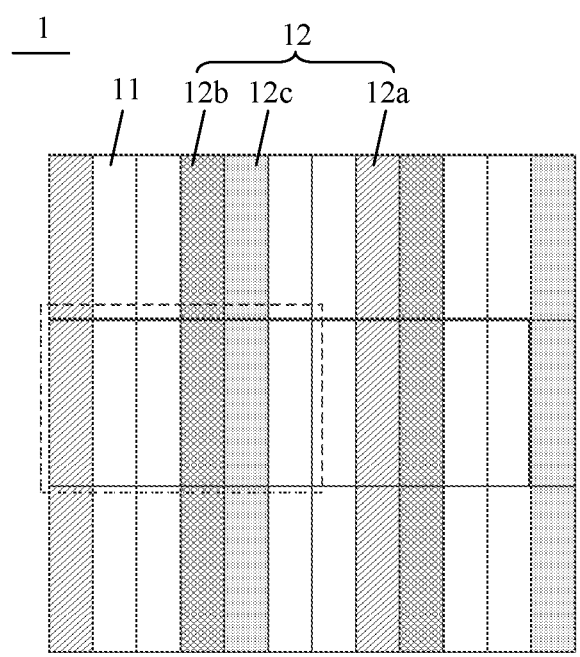
FIG. 10 illustrates a first schematic diagram of an arrangement of sub-pixels according to an embodiment of the present disclosure.

In an example, an arrangement of the sub-pixels in the array substrate 1 is as follows. As shown in FIG. 10, FIG. 10 illustrates a first schematic diagram of an arrangement of sub-pixels according to an embodiment of the present disclosure. Two columns of color sub-pixels 12 are arranged between any two groups of highlight sub-pixels 11, each column of color sub-pixels 12 only includes one of the first color sub-pixel 12a, the second color sub-pixel 12b and the third color sub-pixel 12c, and one column of the first color sub-pixels 12a, one column of the second color sub-pixels 12b and one column of the third color sub-pixels 12c are arranged alternatively. Optionally, as shown in the dotted frame in FIG. 10, each pixel of the array substrate 1 successively includes one first color sub-pixel 12a, two highlight sub-pixels 11, one second color sub-pixel 12b, one third color sub-pixel 12c and one highlight sub-pixel 11 along the row direction, where the area ratio of the highlight sub-pixels 11 to all the sub-pixels is 50%. In such an arrangement manner of sub-pixels, there are two relations between the drive manner of the highlight sub-pixels 11 and the drive manner of the color sub-pixels as follows:

As for a first relation, as shown in FIG. 3 and FIG. 9, the array substrate 1 is further provided with a plurality of gate lines 13 and a plurality of data lines 14 intersecting with the plurality of gate lines 13, the gate lines 13 and the data lines 14 cooperatively define a plurality of pixel areas. A highlight sub-pixel 11 and its adjacent color sub-pixel 12 are located in one pixel area, and the highlight sub-pixel 11 and the adjacent color sub-pixel 12 (the first color sub-pixel 12a, the second color sub-pixel 12b or the third color sub-pixel 12c) share one pixel electrode 15 (not shown in FIG. 3) and one thin film transistor switch 16 (simply indicated by a small rectangular block in FIG. 3, similar in other figures). Each pixel area is provided with one pixel electrode 15 and one thin film transistor switch 16, the gate electrode of the thin film transistor switch 16 is electrically connected with the gate line 13, the source electrode is electrically connected with the data line 14, and the drain electrode is electrically connected with the pixel electrode 15. Correspondingly, as shown in FIG. 4, the first black matrixes 21a and the second black matrixes 21b on the color film substrate 2 also define a plurality of pixel areas, the highlight color filter 221 and its adjacent colored color filter are located in one pixel area, and there is no black matrix 21 therebetween.

On the basis of this, according to the embodiments of the present disclosure, as shown in FIG. 3, two data lines 14 are arranged between any adjacent two columns of color sub-pixels 12, and are respectively corresponding to the thin film transistor switches at two sides thereof. As a result, in one aspect, no data line 14 is arranged between the two columns of highlight sub-pixels 11 of any group of highlight sub-pixels 11, and all the thin film transistors can correspond to the data lines 14; in the other aspect, since two data lines 14 are arranged between adjacent two columns of color sub-pixels 12, and no data line is arranged among other columns of sub-pixels, the second black matrix 21b corresponding to the gap between adjacent two columns of color sub-pixels 12 with two data lines 14 arranged therebetween will be larger than (with an increase amount) the second black matrix 21b corresponding to the gap between adjacent two columns of color sub-pixels 12 with one data line 14 arranged therebetween, the second black matrix 21b corresponding to the gap between adjacent two columns of color sub-pixels 12 arranged with no data line 14 arranged therebetween is smaller than (with a decrease amount) the second black matrix 21b corresponding to the gap between adjacent two columns of color sub-pixels 12 with one data line 14 arranged therebetween, and the increase amount is less than the decrease amount, so that the total area of the second black matrixes 21b on the color film substrate 2 is small, and the area occupied by the black matrix 21 for light shading in the display area of the display panel is small, thus the transmittance of the display panel is higher.

Figure 11:
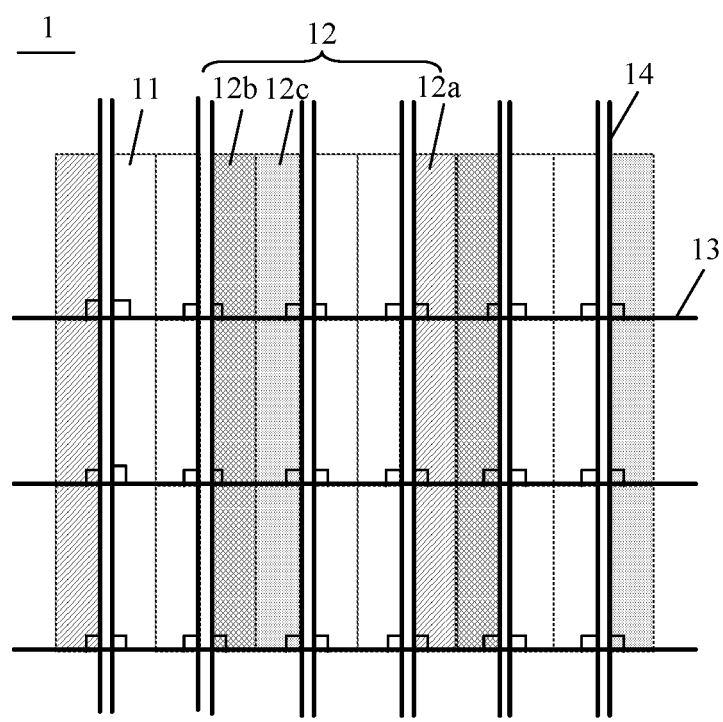
FIG. 11 illustrates a fourth top view of an array substrate according to an embodiment of the present disclosure.
Figure 12:
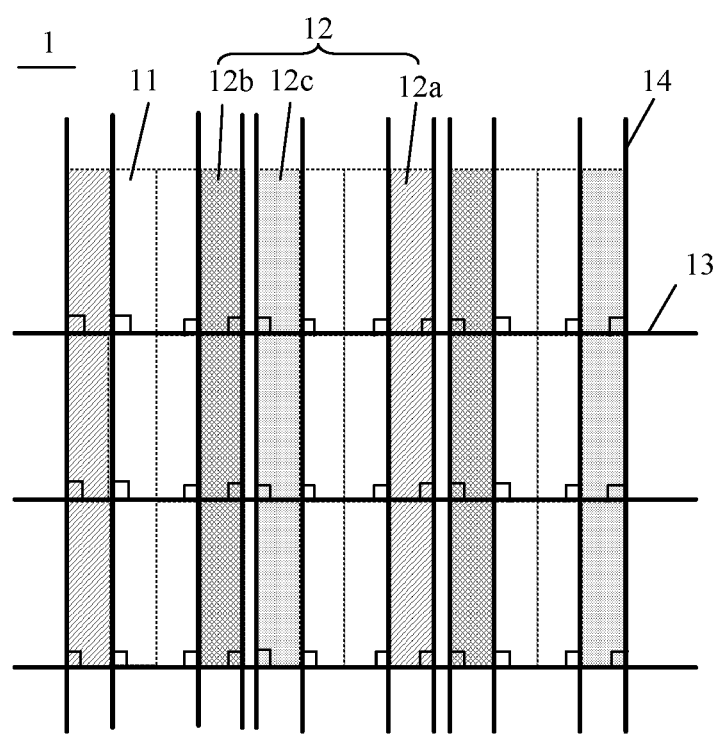
FIG. 12 illustrates a fifth top view of an array substrate according to an embodiment of the present disclosure.
Figure 13:
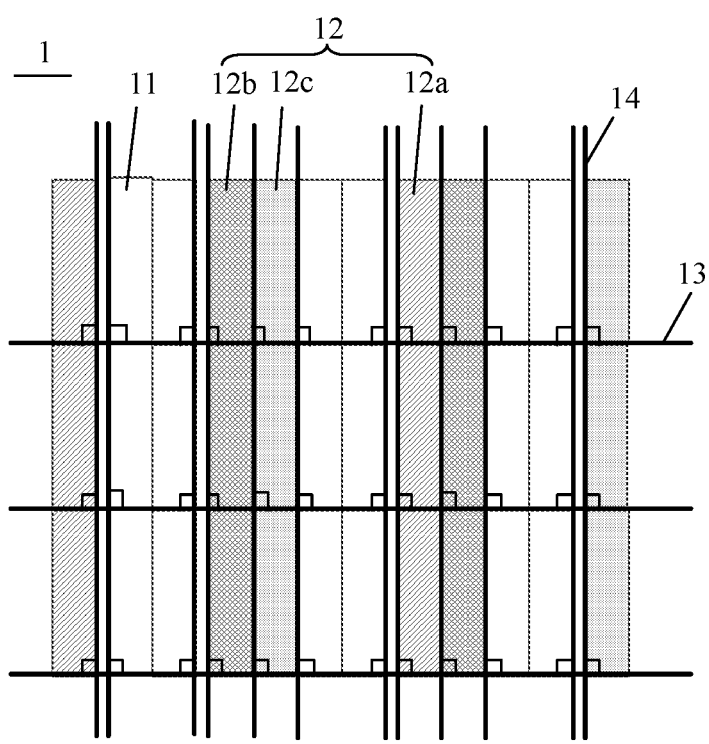
FIG. 13 illustrates a sixth top view of an array substrate according to an embodiment of the present disclosure.
Figure 14:
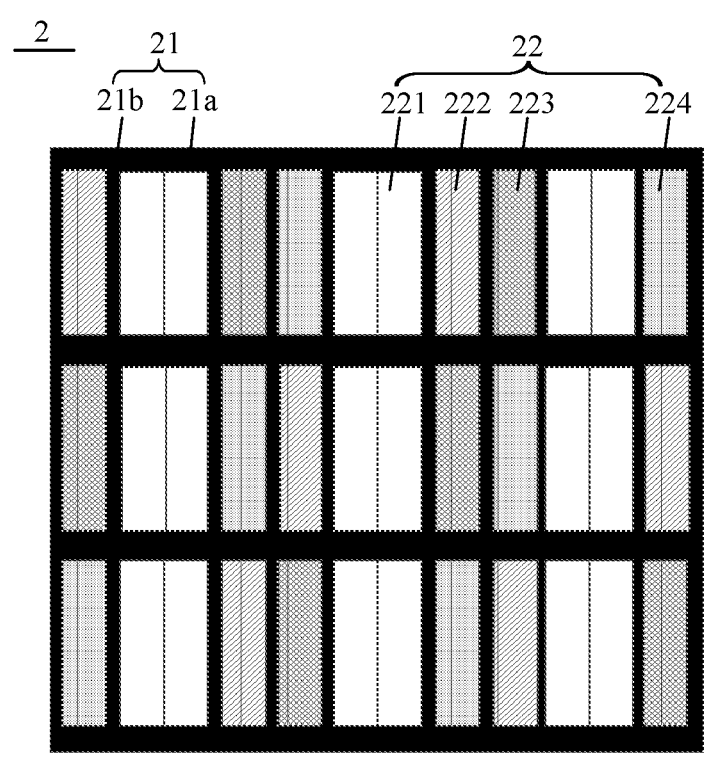
FIG. 14 illustrates a fourth top view of a color film substrate according to an embodiment of the present disclosure.

As for a second relation, as shown in FIG. 11, FIG. 12 and FIG. 13, FIGS. 11-13 illustrates fourth to sixth top views of an array substrate according to embodiments of the present disclosure. The array substrate 1 is further provided with a plurality of gate lines 13 and a plurality of data lines 14 intersecting with the plurality of gate lines 13, the gate lines 13 and the data lines 14 cooperatively define a plurality of pixel areas. The first color sub-pixel 12a, the second color sub-pixel 12b, the third color sub-pixel 12c and the highlight sub-pixel 11 are respectively arranged in one pixel area with a pixel electrode and a thin film transistor switch. Each pixel area is provided with one pixel electrode and one thin film transistor switch, the gate electrode of the thin film transistor switch is electrically connected with the gate line 13, the source electrode is electrically connected with the data line 14, the drain electrode is electrically connected with the pixel electrode. Correspondingly, as shown in FIG. 14, FIG. 14 illustrates a fourth top view of a color film substrate according to an embodiment of the present disclosure. The first black matrixes 21a and the second black matrixes 21b on the color film substrate 2 also define a plurality of pixel areas, the highlight color filter 221, the first colored color filter 222, the second colored color filter 223 and the third colored color filter 224 are respectively located in one pixel area, the highlight color filter 221, the first colored color filter 222, the second colored color filter 223 and the third colored color filter 224 are separated from each other by the black matrix 21.

On the basis of this, embodiments of the present disclosure provide various optional arrangement manners of the data lines. Manner One, as shown in FIG. 11, two data lines 14 are arranged between each column of color sub-pixels 12 and one adjacent column of highlight sub-pixels 11, and the two data lines 14 respectively correspond to the thin film transistor switches at two sides thereof. Manner Two, as shown in FIG. 12, two data lines 14 are arranged between adjacent two columns of color sub-pixels 12, and the two data lines 14 respectively correspond to the thin film transistor switch at two sides thereof; one data line 14 is arranged between each column of color sub-pixels 12 and one adjacent column of highlight sub-pixels 11, and the one data line 14 corresponds to the thin film transistor switches of the highlight sub-pixels 11. Manner Three, as shown in FIG. 13, between any two adjacent groups of highlight sub-pixels 11, two data lines 14 are arranged between one column of highlight sub-pixels 11 in the first group of highlight sub-pixels 11 and one adjacent column of color sub-pixels 12, one data line 14 is arranged between adjacent two columns of color sub-pixels 12, and one data line 14 is arranged between one column of color sub-pixels 12 and one column of highlight sub-pixels 11 in the adjacent second group of highlight sub-pixels 11.

The above-mentioned arrangement manners can achieve that no data line 14 is placed between the two columns of highlight sub-pixels 11 included in each group of highlight sub-pixels 11 and, at the same time, achieve that all the thin film transistors correspond to the data lines 14, so that the display panel can normally display. It should be noted that, compared with Manner Two and Manner Three, each of which includes a situation that two data lines 14 are placed between two adjacent columns of sub-pixels, a situation that no data line 14 is placed between two adjacent columns of sub-pixels, and a situation that one data line 14 is placed between adjacent two columns of sub-pixels at the same time, Manner One only includes a situation that two data lines 14 are placed between two adjacent columns of sub-pixels, and a situation that no data line 14 is placed between adjacent two columns of sub-pixels, so that the total area of the second black matrixes 21b on the color film substrate 2 is smaller, thus the area occupied by the black matrix 21 for light shading in the display area of the display panel is smaller, therefore, the transmittance of the display panel is higher.

Figure 15:
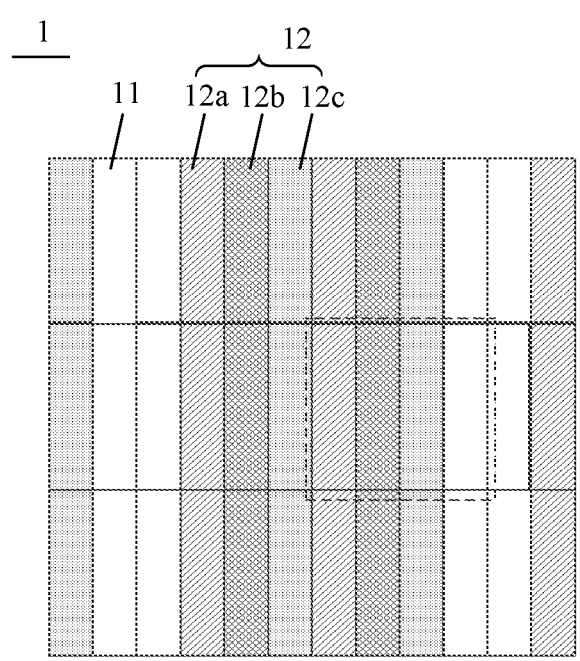
FIG. 15 illustrates a second schematic diagram of an arrangement of sub-pixels according to an embodiment of the present disclosure.

In another example, as shown in FIG. 15, FIG. 15 illustrates a second schematic diagram of an arrangement of sub-pixels according to an embodiment of the present disclosure. Six columns of color sub-pixels 12 are arranged between any two groups of highlight sub-pixels 11, the six columns of color sub-pixels 12 include two columns of first color sub-pixels 12a, two columns of second color sub-pixels 12b and two columns of third color sub-pixels 12c, and one column of the first color sub-pixel 12a, one column of the second color sub-pixel 12b and one column of the third color sub-pixel 12c are arranged alternatively. Optionally, as shown in the dotted frame in FIG. 15, each pixel of the array substrate 1 includes, in the row direction, one first color sub-pixel 12a, one second color sub-pixel 12b, one third color sub-pixel 12c and a highlight sub-pixel 11, the area ratio of the highlight sub-pixels 11 to all the pixels is 25%.

Figure 16:
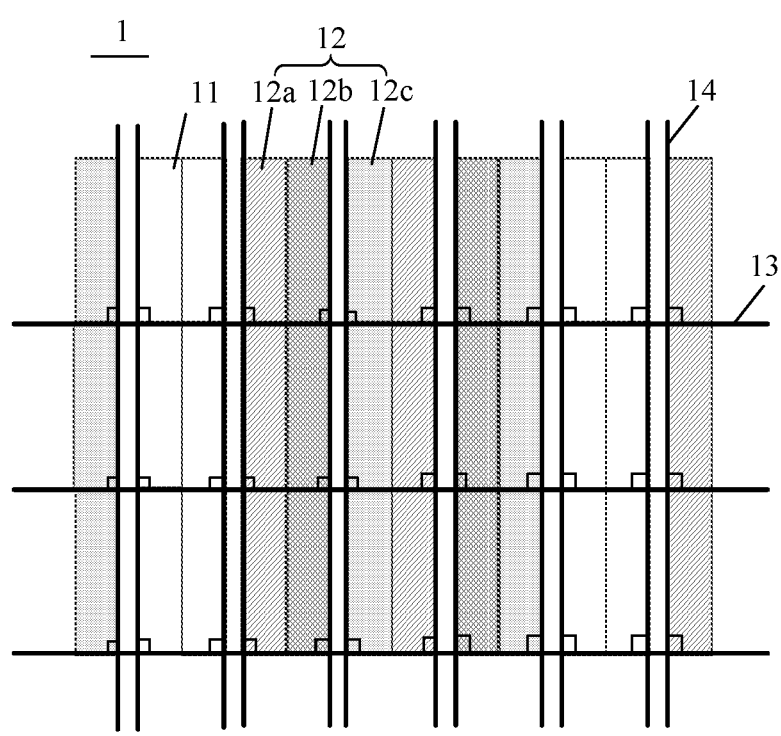
FIG. 16 illustrates a seventh top view of an array substrate according to an embodiment of the present disclosure.
Figure 17:
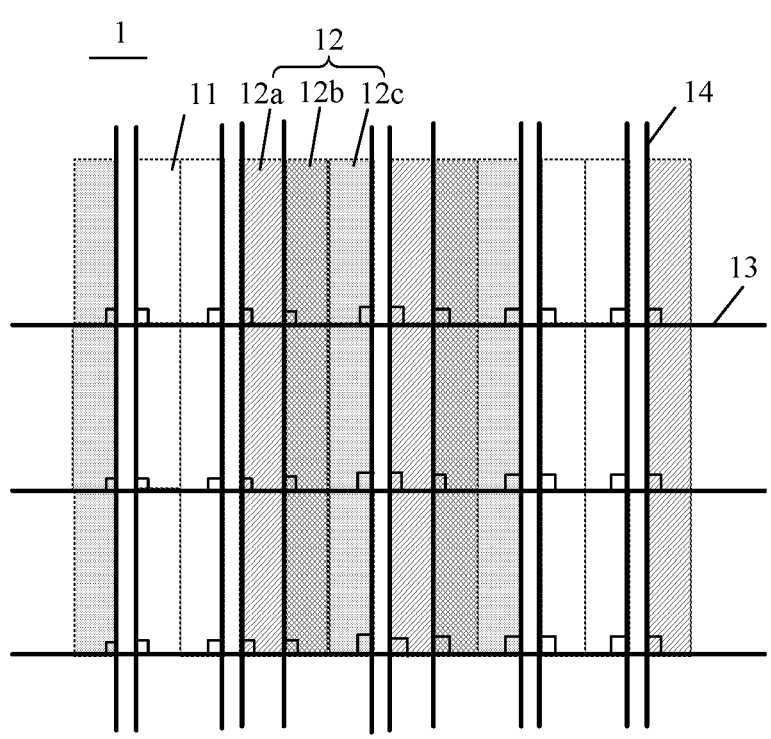
FIG. 17 illustrates an eighth top view of an array substrate according to an embodiment of the present disclosure.
Figure 18:
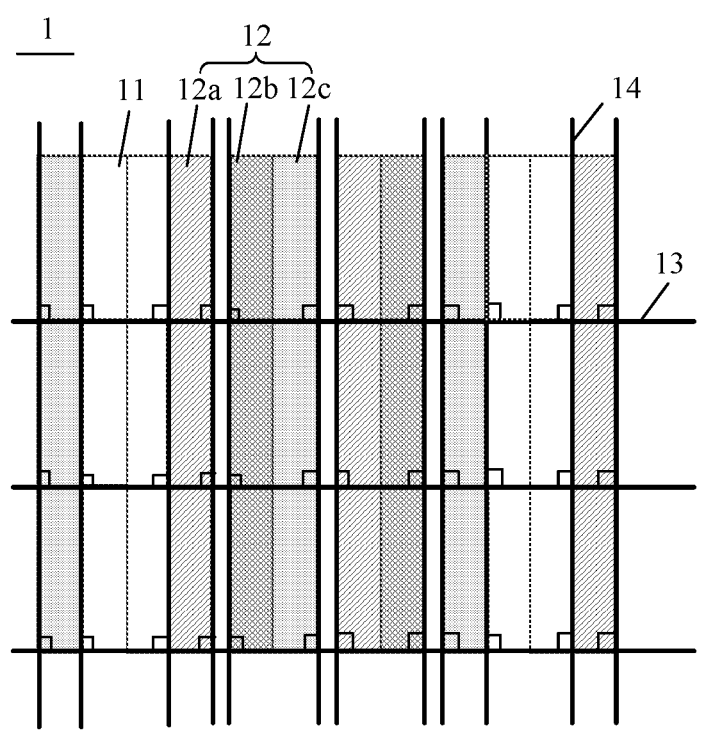
FIG. 18 illustrates a ninth top view of an array substrate according to an embodiment of the present disclosure.
Figure 19:
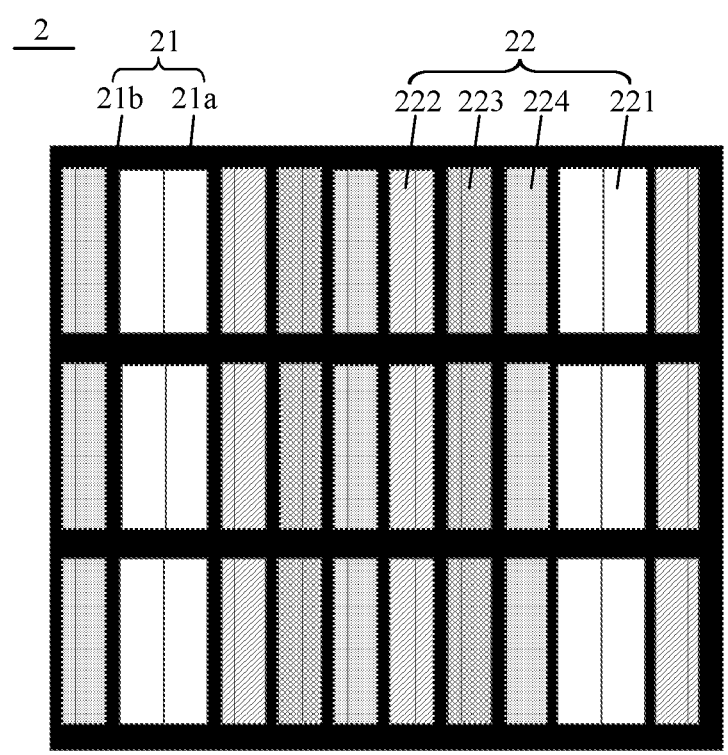
FIG. 19 illustrates a fifth top view of a color film substrate according to an embodiment of the present disclosure.

In such an arrangement manner of sub-pixels, the drive manner of the highlight sub-pixels 11 and the drive manner of the color sub-pixels are as follows: as shown in FIG. 16, FIG. 17 and FIG. 18, FIGS. 16-18 illustrate seventh to ninth top views of an array substrate according to embodiments of the present disclosure. The array substrate 1 is further provided with a plurality of gate lines 13 and a plurality of data lines 14 intersecting with the plurality of gate lines 13, the gate lines 13 and the data lines 14 cooperatively define a plurality of pixel areas. The first color sub-pixel 12a, the second color sub-pixel 12b, the third color sub-pixel 12c and the highlight sub-pixel 11 are respectively arranged in one pixel area with a pixel electrode and a thin film transistor switch. Each pixel area is provided with one pixel electrode and one thin film transistor switch, the gate electrode of the thin film transistor switch is electrically connected with the gate line 13, the source electrode is electrically connected with the data line 14, and the drain electrode is electrically connected with the pixel electrode. Correspondingly, as shown in FIG. 19, FIG. 19 illustrates a fifth top view of a color film substrate according to an embodiment of the present disclosure, the first black matrixes 21a and the second black matrixes 21b on the color film substrate 2 also define a plurality of pixel areas, the highlight color filter 221, the first colored color filter 222, the second colored color filter 223 and the third colored color filter 224 are respectively located in one pixel area, the highlight color filter 221, the first colored color filter 222, the second colored color filter 223 and the third colored color filter 224 are separated from each other by the black matrix 21.

On the basis of this, embodiments of the present disclosure provide various optional arrangement manners of the data lines:

Manner One, as shown in FIG. 16, two data lines 14 are arranged between each column of highlight sub-pixels 11 and a first column of color sub-pixels 12 at a side thereof, one data line 14 corresponds to the thin film transistor switch of the column of highlight sub-pixels 11, and the other data line 14 corresponds to the thin film transistor switch of the first column of color sub-pixels 12; no data line 14 is arranged between the first column of color sub-pixels 12 and a second column of color sub-pixels 12 at this side; two data lines 14 are arranged between the second column of color sub-pixels 12 and a third column of color sub-pixels 12 at this side, one data line 14 corresponds to the thin film transistor switch of the second column of color sub-pixels 12, and the other data line 14 corresponds to the thin film transistor of the third column of color sub-pixels 12. It should be noted that, in such an arrangement manner, six columns of color sub-pixels 12 are arranged between any two groups of highlight sub-pixels 11, although the above arrangement manner only mentions the data lines 14 arranged between one column of highlight sub-pixels 11 in one group of highlight sub-pixels 11 and three columns of color sub-pixels 12 at one side thereof, considering that each group of highlight sub-pixels 11 includes adjacent two columns of highlight sub-pixels 11, as long as each of the two columns of highlight sub-pixels 11 included in each group of highlight sub-pixels 11 and the three adjacent columns of color sub-pixels 12 at one side thereof are arranged according to above manner, the arrangement of all the data lines 14 on the array substrate 1 can be completed, which will not be repeated herein.

For example, as shown in FIG. 16, two data lines 14 are arranged between one column of highlight sub-pixels 11 and one column of first color sub-pixels 12a at the right side of the column of highlight sub-pixels 11, one data line 14 corresponds to the thin film transistor switches of the column of highlight sub-pixels 11, and the other data line 14 corresponds to the thin film transistor switches of the column of first color sub-pixels 12a; no data line 14 is arranged between the column of first color sub-pixels 12a and one column of second color sub-pixels 12b at the right side of the column of first color sub-pixel 12a; two data lines 14 are arranged between the column of second color sub-pixels 12b and one column of third color sub-pixels 12c at the right side of the column of second color sub-pixels 12b, one data line 14 corresponds to the thin film transistor switches of the column of second color sub-pixels 12b, and the other data line 14 corresponds to the thin film transistor switches of the column of third color sub-pixels 12c.

Manner Two, as shown in FIG. 17, between two groups (a first group and a second group) of highlight sub-pixels 11, two data lines 14 are arranged between one column of highlight sub-pixels 11 in the first group of highlight sub-pixels 11 and a first column of color sub-pixels 12 at a side thereof, wherein one data line 14 corresponds to the thin film transistor switches of the column of highlight sub-pixels 11, and the other data line 14 corresponds to the thin film transistor switches of the first column of color sub-pixels 12; one data line 14 is arranged between the first column of color sub-pixels 12 and a second column of color sub-pixels 12 at this side, the data line 14 corresponds to the thin film transistor switches of the second column of color sub-pixels 12; no data line 14 is arranged between the second column of color sub-pixels 12 and a third column of color sub-pixels 12 at this side; two data lines 14 are arranged between the third column of color sub-pixels 12 and a fourth column of color sub-pixels 12 at this side, one data line 14 corresponds to the thin film transistor switches of the third column of color sub-pixels 12, and the other data line 14 corresponds to the thin film transistor switches of the fourth column of color sub-pixels 12; one data line 14 is arranged between the fourth column of color sub-pixels 12 and a fifth column of color sub-pixels 12 at this side, the data line 14 corresponds to the thin film transistor switches of the fifth column of color sub-pixels 12; no data line 14 is arranged between the fifth column of color sub-pixels 12 and a sixth column of color sub-pixels 12 at this side; two data lines 14 are arranged between the sixth column of color sub-pixels 12 and one column of highlight sub-pixels 11 in the second group of highlight sub-pixels 11, one data line 14 corresponds to the thin film transistor switches of the sixth column of color sub-pixels 12, and the other data line 14 corresponds to the thin film transistor switches of the column of highlight sub-pixels 11 in the second group of highlight sub-pixels 11.

For example, as shown in FIG. 17, between two groups (a first group and a second group) of highlight sub-pixels 11, two data lines 14 are arranged between one column of highlight sub-pixels 11 in the first group of highlight sub-pixels 11 and one column of first color sub-pixels 12a at the right side of the column of highlight sub-pixels 11, one data line 14 corresponds to the thin film transistor switches of the column of highlight sub-pixels 11, and the other data line 14 corresponds to the thin film transistor switches of the column of first color sub-pixels 12a; one data line 14 is arranged between the column of first color sub-pixels 12a and one column of second color sub-pixels 12b at the right side of the column of first color sub-pixels 12a, the data line 14 corresponds to the thin film transistor switches of the column of second color sub-pixels 12b; no data line 14 is arranged between the column of second color sub-pixels 12b and one column of third color sub-pixels 12c at the right side of the column of second color sub-pixels 12b; two data lines 14 are arranged between the column of third color sub-pixels 12c and one column of first color sub-pixels 12a at the right side of the column of third color sub-pixels 12a, one data line 14 corresponds to the thin film transistor switches of the column of third color sub-pixels 12c, and the other data line 14 corresponds to the thin film transistor switches of the column of first color sub-pixels 12a; one data line 14 is arranged between the column of first color sub-pixels 12a and one column of second color sub-pixels 12b at the right side of the column of first color sub-pixels 12a, the data line 14 corresponds to the thin film transistor switches of the column of second color sub-pixels 12b; no data line 14 is arranged between the column of second color sub-pixels 12b and one column of third color sub-pixels 12c at the right side of the column of second color sub-pixels 12b; two data lines 14 are arranged between the column of third color sub-pixels 12c and one column of highlight sub-pixels 11 in the second group of highlight sub-pixels 11, one data line 14 corresponds to the thin film transistor switches of the column of third color sub-pixels 12c, and the other data line 14 corresponds to the thin film transistor switches of the column of highlight sub-pixels 11 in the second group of highlight sub-pixels 11.

Manner 3, as shown in FIG. 18, between two groups (a first group and a second group) of highlight sub-pixels 11, one data line 14 is arranged between one column of highlight sub-pixels 11 in the first group of highlight sub-pixels 11 and one first column of color sub-pixels 12 at a side of the column of highlight sub-pixels 11, the data line 14 corresponds to the thin film transistor switches of the column of highlight sub-pixels 11; two data lines 14 are arranged between the first column of color sub-pixels 12 and a second column of color sub-pixels 12 at this side, one data line 14 corresponds to the thin film transistor switches of the first column of color sub-pixels 12, and the other data line 14 corresponds to the thin film transistor switches of the second column of color sub-pixels 12; no data line 14 is arranged between the second column of color sub-pixels 12 and a third column of color sub-pixels 12 at this side; two data lines 14 are arranged between the third column of color sub-pixels 12 and a fourth column of color sub-pixels 12 at this side, one data line 14 corresponds to the thin film transistor switches of the third column of color sub-pixels 12, and the other data line 14 corresponds to the thin film transistor switches of the fourth column of color sub-pixels 12; no data line 14 is arranged between the fourth column of color sub-pixels 12 and a fifth column of color sub-pixels 12 at this side; two data lines 14 are arranged between the fifth column of color sub-pixels 12 and a sixth column of color sub-pixels 12 at this side, one data line 14 corresponds to the thin film transistor switches of the fifth column of color sub-pixels 12, and the other data line 14 corresponds to the thin film transistor switches of the sixth column of color sub-pixels 12; one data line 14 is arranged between the sixth column of color sub-pixels 12 and one column of highlight sub-pixels 11 in the second group of highlight sub-pixels 11, the data line 14 corresponds to the thin film transistor switches of the column of highlight sub-pixels 11 in the second group of highlight sub-pixels 11.

For example, as shown in FIG. 18, between two groups (a first group and a second group) of highlight sub-pixels 11, one data line 14 is arranged between one column of highlight sub-pixels 11 in the first group of highlight sub-pixels 11 and one column of first color sub-pixels 12a at the right side thereof, the data line 14 corresponds to the thin film transistor switches of the column of highlight sub-pixels 11; two data lines 14 are arranged between the column of first color sub-pixels 12a and a column of second color sub-pixels 12b at the right side thereof, one data line 14 corresponds to the thin film transistor switches of the column of first color sub-pixels 12a, and the other data line 14 corresponds to the thin film transistor switches of the column of second color sub-pixels 12b; no data line 14 is arranged between the column of second color sub-pixels 12b and a column of third color sub-pixels 12c at the right side thereof; two data lines 14 are arranged between the column of third color sub-pixels 12c and a column of first color sub-pixels 12a at the right side thereof, one data line 14 corresponds to the thin film transistor switches of the column of third color sub-pixels 12c, and the other data line 14 corresponds to the thin film transistor switches of the column of first color sub-pixels 12a; no data line 14 is arranged between the column of first color sub-pixels 12a and a column of second color sub-pixels 12b at the right side thereof; two data lines 14 are arranged between the column of second color sub-pixels 12b and a column of third color sub-pixels 12c at the right side thereof, one data line 14 corresponds to the thin film transistor switch of the column of second color sub-pixels 12b, and the other data line 14 corresponds to the thin film transistor switches of the column of third color sub-pixels 12c; one data line 14 is arranged between the column of third color sub-pixels 12c and one column of highlight sub-pixels 11 in the second group of highlight sub-pixels 11, the data line 14 corresponds to the thin film transistor switches of the column of highlight sub-pixels 11 in the second group of highlight sub-pixels 11.

Each of the above-mentioned arrangement manners can achieve that no data line 14 is placed between the two columns of highlight sub-pixels 11 included in each group of highlight sub-pixels 11 and, at the same time, achieve that all the thin film transistors correspond to the data lines 14, so that the display panel can normally display. It should be noted that, compared with Manner Two and Manner Three, each of which includes a situation that two data lines 14 are placed between two adjacent columns of sub-pixels, a situation that no data line 14 is placed between two adjacent columns of sub-pixels, and a situation that one data line 14 is placed between adjacent two columns of sub-pixels at the same time, Manner One only includes a situation that two data lines 14 are placed between two adjacent columns of sub-pixels, and a situation that no data line 14 is placed between adjacent two columns of sub-pixels, so that the total area of the second black matrixes 21b on the color film substrate 2 is smaller, thus the area occupied by the black matrix 21 for light shading in the display area of the display panel is smaller, therefore, the transmittance of the display panel is higher.

Figure 20:
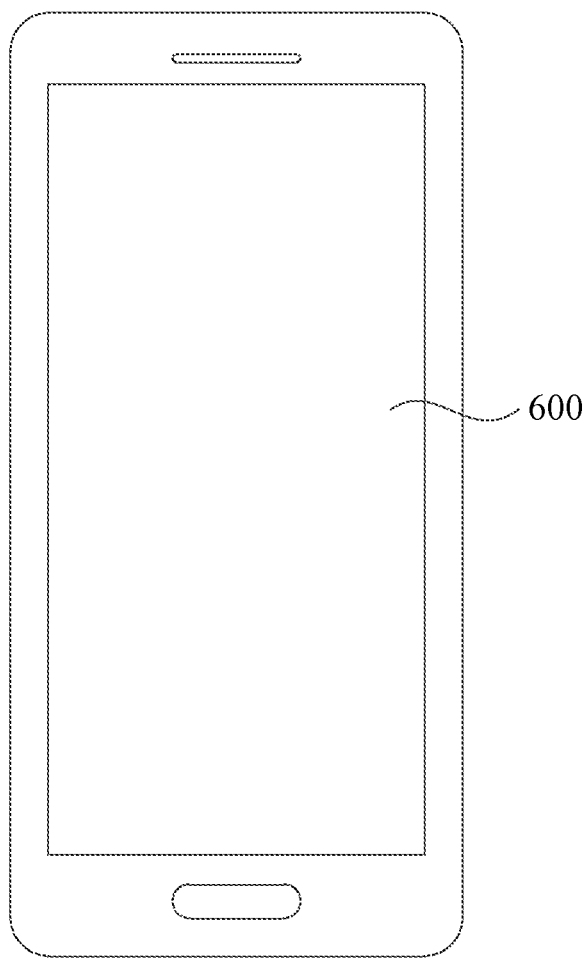
FIG. 20 illustrates a top view of a display device according to an embodiment of the present disclosure.

Moreover, an embodiment of the present disclosure provides a display device, as shown in FIG. 20, FIG. 20 illustrates a top view of a display device according to an embodiment of the present disclosure. The display device includes the display panel 600 according to any one of the above embodiments. The display device provided by the present disclosure can be any product or component having display function, such as smart phone, wearable smart watch, smart glasses, tablet PC, television, display screen, laptop, digital photo frame, navigator, car monitor, electrophoretic display, e-Book etc. The display panel and the display device provided by the embodiment of the present disclosure can be flexible, or can also be non-flexible, which will not be limited in the present disclosure.

The embodiments of the present disclosure provide a display panel and a display device. In the display panel, every two adjacent columns of highlight sub-pixels in the array substrate form a group of highlight sub-pixels, at least one column of color sub-pixels is arranged between any two groups of highlight sub-pixels, correspondingly, every two adjacent columns of highlight color filters in the color film substrate form a group of highlight color filters, at least one column of colored color filters is arranged between any two groups of highlight color filters. Since the colors of the output light of adjacent two columns of highlight sub-pixels and adjacent two columns of highlight color filters are the same, color mixture will not occur, thus the orthogonal projection of the second black matrix on the color film substrate does not overlap with the orthogonal projection of the gap between the adjacent two columns of highlight color filters on the color film substrate, which effectively reduces the area occupied by the black matrix for light shading in the display area of the display panel, and improves the open rate of the display panel, thereby improving the transparent display effect of the display panel.

The above are just the preferred embodiments of the present disclosure, which will not limit the present disclosure. Any modifications, equivalent replacements and improvements made within the spirits and principles of the present application shall all fall in the protection scope of the present application.

What is claimed is:

1. A display panel, comprising:
   an array substrate; and
   a color film substrate arranged opposite to the array substrate;
   wherein the array substrate comprises a plurality of columns of highlight sub-pixels and a plurality of columns of color sub-pixels; every two directly adjacent columns of highlight sub-pixels of the plurality of columns of highlight sub-pixels form a group of highlight sub-pixels, at least one column of color sub-pixels of the plurality of columns of color sub-pixels is arranged between any two groups of highlight sub-pixels; each column of color sub-pixels of the plurality of columns of color sub-pixels comprises at least one type of a first color sub-pixel, a second color sub-pixel and a third color sub-pixel;
   wherein the color film substrate comprises a black matrix and a plurality of color filters arranged in an array; in a row direction, the black matrix comprises a first black matrix corresponding to a gap between adjacent two sub-pixels and, in a column direction, the black matrix comprises a second black matrix corresponding to a gap between adjacent two sub-pixels; the plurality of color filters comprises a plurality of columns of highlight color filters and a plurality of columns of colored color filters, every two adjacent columns of highlight color filters of the plurality of columns of highlight color filters form a group of highlight color filters, at least one column of colored color filters of the plurality of columns of colored color filters is arranged between any two groups of highlight color filters, and each column of colored color filters of the plurality of columns of colored color filters comprises at least one type of a first colored color filter, a second colored color filter and a third colored color filter; an orthogonal projection of the second black matrix on the color film substrate does not overlap with an orthogonal projection of the gap between the two adjacent columns of highlight color filters on the color film substrate;
   wherein six columns of color sub-pixels are arranged between any two groups of highlight sub-pixels, the six columns of color sub-pixels comprise two columns of first color sub-pixels, two columns of second color sub-pixels and two columns of third color sub-pixels, and one column of first color sub-pixels, one column of second color sub-pixels and one column of third color sub-pixels are arranged alternately;

wherein the array substrate is further provided with a plurality of gate lines and a plurality of data lines intersecting with the plurality of gate lines, the plurality of gate lines and the plurality of data lines cooperatively define a plurality of pixel areas, and each first color sub-pixel of the plurality of columns of color sub-pixels, each second color sub-pixel of the plurality of columns of color sub-pixels, each third color sub-pixel of the plurality of columns of color sub-pixels and each highlight sub-pixel of the plurality of columns of highlight sub-pixels are respectively arranged in one pixel area of the plurality of pixel areas with a corresponding pixel electrode and a corresponding thin film transistor switch;

wherein no data line is arranged between the two columns of highlight sub-pixels comprised in each group of highlight sub-pixels; and wherein at a side of each column of highlight sub-pixels of the plurality of columns of highlight sub-pixels, along a direction away from this column of highlight sub-pixels, a first column of color sub-pixels is one column of color sub-pixels of the six columns of color sub-pixels that is closest to the column of highlight sub-pixels, a second column of color sub-pixels is another column of color sub-pixels of the six columns of color sub-pixels that is closest to the first column of color sub-pixels, and a third column of color sub-pixels is still another column of color sub-pixels of the six columns of color sub-pixels that is closest to the second column of color sub-pixels, wherein two data lines of the plurality of data lines are arranged between the column of highlight sub-pixels and the first column of color sub-pixels, wherein one data line of the two data lines corresponds to the thin film transistor switches of the column of highlight sub-pixels, and the other data line of the two data lines corresponds to the thin film transistor switches of the first column of color sub-pixels; no data line is arranged between the first column of color sub-pixels and the second column of color sub-pixels; another two data lines of the plurality of data lines are arranged between the second column of color sub-pixels and the third column of color sub-pixels, wherein one data line of the another two data lines corresponds to the thin film transistor switches of the second column of color sub-pixels, and the other data line of the another two data lines corresponds to the thin film transistor switches of the third column of color sub-pixels.

2. The display panel according to claim 1, wherein the first color sub-pixel, the second color sub-pixel and the third color sub-pixel are respectively one of a red sub-pixel, a green sub-pixel and a blue sub-pixel.

3. The display panel according to claim 1, wherein each highlight sub-pixel of the plurality of columns of highlight sub-pixels is either a white sub-pixel or a yellow sub-pixel.

4. The display panel according to claim 1, wherein each sub-pixel of the plurality of columns of highlight sub-pixels and the plurality of columns of color sub-pixels has a rectangle shape, and has a same size, with a width-length ratio of 1:2 or 1:3.

5. The display panel according to claim 3, wherein each highlight color filter of the plurality of columns of highlight color filters is either a white color filter or a yellow color filter.

6. The display panel according to claim 5, wherein each highlight color filter of the plurality of columns of highlight color filters is a white color filter, the color film substrate further comprises a transparent protection layer located at a side of the plurality of color filters arranged in array close to the array substrate, and the highlight color filter and the transparent protection layer are made of a same material.

7. The display panel according to claim 1, wherein an orthogonal projection of the first black matrix on the color film substrate does not overlap with an orthogonal projection of the two adjacent highlight color filters on the color film substrate.

8. A display device, comprising a display panel, wherein the display panel comprises:

an array substrate; and a color film substrate arranged opposite to the array substrate, wherein the array substrate comprises a plurality of columns of highlight sub-pixels and a plurality of columns of color sub-pixels; every two directly adjacent columns of highlight sub-pixels of the plurality of columns of highlight sub-pixels form a group of highlight sub-pixels, at least one column of color sub-pixels of the plurality of columns of color sub-pixels is arranged between any two groups of highlight sub-pixels; each column of color sub-pixels of the plurality of columns of color sub-pixels comprises at least one type of a first color sub-pixel, a second color sub-pixel and a third color sub-pixel;

wherein the color film substrate comprises a black matrix and a plurality of color filters arranged in an array; in a row direction, the black matrix comprises a first black matrix corresponding to a gap between adjacent two sub-pixels and, in a column direction, the black matrix comprises a second black matrix corresponding to a gap between adjacent two sub-pixels; the plurality of color filters comprises a plurality of columns of highlight color filters and a plurality of columns of colored color filters, every two adjacent columns of highlight color filters of the plurality of columns of highlight color filters form a group of highlight color filters, at least one column of colored color filters of the plurality of columns of colored color filters is arranged between any two groups of highlight color filters, and each column of colored color filters of the plurality of columns of colored color filters comprises at least one type of a first colored color filter, a second colored color filter and a third colored color filter; an orthogonal projection of the second black matrix on the color film substrate does not overlap with an orthogonal projection of the gap between the two adjacent columns of highlight color filters on the color film substrate;

wherein six columns of color sub-pixels are arranged between any two groups of highlight sub-pixels, the six columns of color sub-pixels comprise two columns of first color sub-pixels, two columns of second color sub-pixels and two columns of third color sub-pixels, and one column of first color sub-pixels, one column of second color sub-pixels and one column of third color sub-pixels are arranged alternately;

wherein the array substrate is further provided with a plurality of gate lines and a plurality of data lines intersecting with the plurality of gate lines, the plurality of gate lines and the plurality of data lines cooperatively define a plurality of pixel areas, and each first color sub-pixel of the plurality of columns of color sub-pixels, each second color sub-pixel of the plurality of columns of color sub-pixels, each third color sub-pixel of the plurality of columns of color sub-pixels and each highlight sub-pixel of the plurality of columns of highlight sub-pixels are respectively arranged in one pixel area of the plurality of pixel areas with a corresponding pixel electrode and a corresponding thin film transistor switch;

wherein no data line is arranged between the two columns of highlight sub-pixels comprised in each group of highlight sub-pixels; and wherein at a side of each column of highlight sub-pixels of the plurality of columns of highlight sub-pixels, along a direction away from this column of highlight sub-pixels, a first column of color sub-pixels is one column of color sub-pixels of the six columns of color sub-pixels that is closest to the column of highlight sub-pixels, a second column of color sub-pixels is another column of color sub-pixels of the six columns of color sub-pixels that is closest to the first column of color sub-pixels, and a third column of color sub-pixels is still another column of color sub-pixels of the six columns of color sub-pixels that is closest to the second column of color sub-pixels, wherein two data lines of the plurality of data lines are arranged between the column of highlight sub-pixels and the first column of color sub-pixels, wherein one data line of the two data lines corresponds to the thin film transistor switches of the column of highlight sub-pixels, and the other data line of the two data lines corresponds to the thin film transistor switches of the first column of color sub-pixels; no data line is arranged between the first column of color sub-pixels and the second column of color sub-pixels; another two data lines of the plurality of data lines are arranged between the second column of color sub-pixels and the third column of color sub-pixels, wherein one data line of the another two data lines corresponds to the thin film transistor switches of the second column of color sub-pixels, and the other data line of the another two data lines corresponds to the thin film transistor switches of the third column of color sub-pixels.

* * * * *